United States Patent
Takayasu et al.

(10) Patent No.: US 7,037,839 B2
(45) Date of Patent: May 2, 2006

(54) METHOD FOR POLISHING ORGANIC FILM ON SEMICONDUCTOR SUBSTRATE BY USE OF RESIN PARTICLES, AND SLURRY

(75) Inventors: Jun Takayasu, Yokkaichi (JP); Satoshi Murakami, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 10/353,962

(22) Filed: Jan. 30, 2003

(65) Prior Publication Data

US 2004/0067652 A1   Apr. 8, 2004

(30) Foreign Application Priority Data

Oct. 2, 2002   (JP) ........................................ 2002-290106

(51) Int. Cl.
*H01L 21/302*   (2006.01)

(52) U.S. Cl. ........................... 438/691; 438/692; 216/89

(58) Field of Classification Search ......... 438/690–693; 252/79.1–79.5; 216/89
See application file for complete search history.

(56) References Cited

U.S. PATENT DOCUMENTS

| | | | |
|---|---|---|---|
| 6,235,636 B1 | | 5/2001 | Ng et al. |
| 6,375,545 B1 | * | 4/2002 | Yano et al. .................... 451/36 |
| 6,416,685 B1 | * | 7/2002 | Zhang et al. ............... 252/79.1 |
| 6,620,215 B1 | * | 9/2003 | Li et al. ........................ 51/298 |
| 6,641,632 B1 | * | 11/2003 | Ronay .......................... 51/309 |
| 6,736,992 B1 | * | 5/2004 | Zhang et al. ............... 252/79.1 |
| 6,740,590 B1 | * | 5/2004 | Yano et al. .................. 438/692 |

FOREIGN PATENT DOCUMENTS

| | | |
|---|---|---|
| JP | 2-51951 | 11/1990 |
| JP | 07-086216 | 3/1995 |
| JP | 11-87307 | 3/1999 |
| JP | 2001-277105 | 10/2001 |

OTHER PUBLICATIONS

Notification for filing Opinion (Office Action) for Korean Patent Application No. 10–2003–0068158, mailed Aug. 31, 2005 and English translation thereof.

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method for polishing an organic film, comprising polishing an exposed organic film provided on a semiconductor substrate by use of slurry containing resin particles.

14 Claims, 8 Drawing Sheets

METHOD FOR POLISHING ORGANIC FILM ON SEMICONDUCTOR SUBSTRATE BY USE OF RESIN PARTICLES, AND SLURRY

CROSS-REFERENCE TO RELATED APPLICATIONS

This application is based upon and claims the benefit of priority from the prior Japanese Patent Application No. 2002-290106, filed Oct. 2, 2002, the entire contents of which are incorporated herein by reference.

BACKGROUND OF THE INVENTION

1. Field of the Invention

The present invention relates to a method for polishing an organic film, such as a resist or the like, on a semiconductor substrate, by use of resin particles, and slurry for use in the polishing.

2. Description of the Related Art

As conventional techniques, there is a tape-like polishing agent prepared by applying thermosetting resin particles and a binder onto a film base material and then drying them (e.g., see page 3 of Jpn. Pat. Appln. KOKOKU Publication No. 2-51951), and there is known a micro-spherical polishing agent made of a melamine phenol polyimide resin, and a co-rubbing polishing method (e.g., see page 2 of Jpn. Pat. Appln. KOKAI Publication No. 2001-277105). In addition, there is a method for subjecting to CMP treatment a resist surface cured by an ion beam implantation or plasma etching (e.g., see page 1 and FIG. 4 of U.S. Pat. No. 6,235,636), and a chemical mechanical polishing of a resist which comprises pressing a polishing cloth against a wafer while supplying fuming nitric acid (e.g., see the abstract and FIG. 3 of Jpn. Pat. Appln. KOKAI Publication No. 11-87307).

Until now, a chemical mechanical polishing method (CMP method) has been used in which a slurry containing silica particles is used as a polishing material, in flattening a surface of a semiconductor wafer having an uneven substrate on which fine slots and the like are formed, and a resist film deposited on the uneven substrate surface including inner surface parts of the slots and the like.

Description will now be made of a manufacturing method of a capacitor by use of the CMP method utilizing silica particles.

First, FIGS. 6A to 6C are sectional views showing a capacitor manufacturing process (trench structure) according to a first conventional example. Here, a region on a silicon substrate 61 in which deep and narrow slots DT (deep trench) are formed is referred to as a cell array section 6a, and a region in which no slots DT are formed is referred to as a field section 6b.

As shown in FIG. 6A, the slots DT are formed in the silicon substrate 61 by using, e.g., an RIE technique. An ASG film 62 is formed on inner surfaces of the slots DT, and a resist film 63 is formed to a predetermined thickness to completely fill the slots DT. Accordingly, a surface of the resist film 63 in the cell array section 6a is lower than that in the field section 6b with respect to a flat surface indicated by a broken line, whereby a step is formed on the surface of the resist film 63.

Afterward, the resist film 63 is etched back in order to leave the resist film at a predetermined height from the slots DT. However, the etching-back step is a uniform etching operation carried out by using the surface of the resist film 63 as a reference, and therefore, it is impossible to form a resist film having a uniform height from the bottoms of the slots DT. As shown in FIG. 6B, resist films 631 to 636 having a nonuniform thickness on which the step shape of the resist film surface is reflected are formed in the respective slots DT.

Subsequently, the resist films 631 to 636 left in the respective slots DT are used as masks to etch the ASG film 62 not covered with the resist films 631 to 636, and then, the resist films 631 to 636 are etched off. Accordingly, heights of the resist films 631 to 636 are patterned in the ASG film 62 formed in the slots DT, whereby ASG films (not shown) having a nonuniform height are formed in the respective slots DT.

Then, an unillustrated tetraethoxy silane film (TEOS film) is formed on the silicon substrate 61 including inner surface parts of the slots DT, and a heat treatment is carried out to inject an impurity As contained in the ASG film into the silicon substrate 61, whereby an As diffused region 66 is formed. Thus, the As diffused region 66, in which heights in the slots DT are nonuniform, is formed as a common electrode of capacitors in the silicon substrate 61.

Afterward, the TEOS film and the ASG film are removed to form a nitric oxide film (NO film) 67 on the substrate, which includes the inner surface parts of the slots DT, whereby a capacitor insulating film is formed. Further, polysilicon is deposited to fill the slots DT.

Subsequently, the polysilicon is flattened to be on the same plane as a surface of the NO film 67, and other electrodes 681 to 686 are formed in the slots DT. Accordingly, capacitors as shown in FIG. 6C are formed.

The height of the As diffused region 66, which is the common electrode of the capacitors, is not uniform, and opposing areas of the As diffused region 66 and the NO film 67, which is a capacitor insulating film, are not uniform. Consequently, uniformity of opposing areas of electrodes for each capacitor cannot be secured, whereby capacitors having nonuniform capacity values are formed.

In order to deal with the formation of such nonuniform capacitors, the slots DT may be formed deeper to secure a minimum capacity sufficient for a semiconductor device. However, the formation of the deeper trenches DT may impose a performance/control load on a device manufacturing process, consequently causing a problem of impossibility of manufacturing a device of expected performance.

FIGS. 7A to 7D are sectional views showing a capacitor manufacturing process (trench structure) according to a second conventional example.

As shown in FIG. 7A, the plurality of slots DT are formed in a silicon substrate 61.

An ASG film 62 is formed on inner wall surfaces of the respective slots DT, and a resist film 63 is also formed. Accordingly, a surface of the resist film 63 in a cell array section 6a is lower than that in a field section 6b with respect to a flat surface indicated by a broken line, and a step is formed on the surface of the resist film 63.

Then, a known CMP method is used to polish the resist film 63. However, because of hard silica particles, polishing is carried out to the ASG film 62 below the resist film 63. Consequently, an erosion 71 or a scratch 72 shown in FIG. 7B occurs. In addition, the formation of the slots DT in the substrate 61 causes clogging 73, where openings of the slots DT are clogged with silica particles.

Then, as shown in FIG. 7C, resist films 741 to 746 are etched back. However, clogging of the opening with silica particles prevents etching-back of the resist film 743.

Consequently, the height of the resist film 743 is not uniform with those of resist films 771 to 775.

Subsequently, each of the resist films 771 to 775, and the resist film 743 are used as masks to etch the ASG film 62. Then, the resist films 771 to 775, and the resist film 743 are etched off. Accordingly, heights of the resist films 771 to 775 and the resist film 743 are patterned in the ASG film 62 formed in the slots DT, whereby ASG films (not shown) having a nonuniform height are formed in the slots DT.

Then, an unillustrated tetraethoxy silane film (TEOS film) is formed on the substrate, which includes inner surface parts of the slots DT, and a heat treatment is carried out to inject an impurity contained in the ASG film into the silicon substrate 61, whereby an As diffused region 75 is formed. Thus, the nonuniform As diffused region 75 is formed as a common electrode of capacitors in the silicon substrate 61.

Then, the TEOS film and the ASG film are removed to form a nitric oxide film (NO film) 67 on the substrate, which includes the inner surface parts of the slots DT, whereby a capacitor insulating film is formed. Further, polysilicon is deposited on the substrate 61 including the inner side of the slots DT. Then, the polysilicon is etched to be flattened on the surface of the NO film 67, thereby forming other electrodes 761 to 766. Accordingly, capacitors as shown in FIG. 7D are formed.

The height of the As diffused region 66 in the slots DT, which is the common electrode of the capacitors, is not uniform, and opposing areas of the As diffused region 66 and the NO film 67, which is a capacitor insulating film, are not uniform. Consequently, equal opposing areas of electrodes for capacitors cannot be secured, thus capacitors having nonuniform capacity values are formed. Therefore, the above-described problem occurs.

FIGS. 8A to 8C are sectional views showing a capacitor manufacturing process (stack structure) according to a third conventional example.

As shown in FIG. 8A, on a substrate 81, an insulating film 82 is formed flat to a predetermined thickness, and slots SN (storage node) are formed by using an RIE technique. A polysilicon film 83 is formed to be uniform in thickness on a surface of the insulating film 82, which includes inner surface parts of the slots SN, and a resist film 84 is formed to a predetermined thickness to fill the slots SN.

Then, silica particles are used to polish upper parts of the resist film 84 and the polysilicon film 83 by a CMP method, whereby resist masks 841 to 845 are formed. Consequently, an erosion 85 or a scratch 86 shown in FIG. 8B occurs. In addition, an opening of a slot SN is clogged with silica particles, which form a clogging 87.

Then, the resist masks 841 to 845 are etched off. However, because of the clogging 87 at the opening of the slot SN, the resist mask 843 is left unetched. Then, the insulating film 82 is etched to simultaneously remove the clogging 87. However, the resist mask 843 may still remains.

Subsequently, a nitric oxide film (NO film) 89 is formed on polysilicon electrodes 831 to 835 and the substrate 61 to form a capacitor insulating film 89. Then, a polysilicon electrode 88 is formed on the NO film 89 to form an opposite common electrode of capacitors.

Accordingly, because of the electrodes, opposing areas of which are nonuniform, the capacitors have nonuniform capacity values. In addition, the resist mask 843 is left unetched. Consequently, this section has lost its function as a capacitor.

Furthermore, in order to deal with the formation of such nonuniform capacity values, the slots SN may be formed higher to secure a minimum capacity sufficient for a semiconductor device. However, the formation of the higher slots SN may impose a performance/control load on a device manufacturing process, consequently causing a problem of impossibility of manufacturing a semiconductor device of expected performance.

BRIEF SUMMARY OF THE INVENTION

An aspect of the present invention provided a method for polishing an organic film, comprising polishing a semiconductor substrate having an exposed organic film by use of a slurry containing resin particles.

Furthermore, another aspect of the present invention provides a slurry for chemical mechanical polishing, which is a suspension prepared by dispersing resin particles in a liquid having a chemical polishing function for an organic film.

According to the polishing by use of the slurry of the foregoing constitution, the organic film is polished without damaging a foundation layer of the organic film which is a polishing target, whereby its surface can be flattened in a good condition. For example, the slurry can be used for a manufacturing process of a semiconductor device to improve the manufacturing yield.

DETAILED DESCRIPTION OF THE INVENTION

Next, detailed description will be made of the embodiments of the present invention with reference to the accompanying drawings.

Figure 1A:
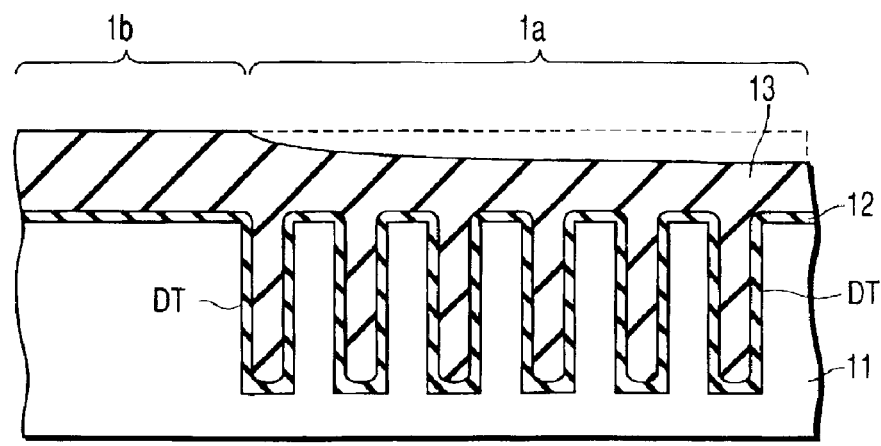
FIGS. 1A to 1C are sectional views showing a capacitor forming process according to a first embodiment of the present invention.

FIGS. 1A to 3D are sectional views showing a capacitor (trench structure) forming process according to a first embodiment of the present invention. As shown in FIG. 1A, predetermined patterns for capacitor formation are formed on a surface of a silicon substrate 11 to form, e.g., memory cells of a DRAM. Based on these patterns, a plurality of deep and narrow slots DT are formed to be uniform in size in predetermined parts of the silicon substrate 11 by using, e.g., a reactive ion etching (RIE) technique. In this case, a region in which the slots DT are formed is set as a cell array section 1a, and a region in which no slots DT are formed is set as a field section 1b.

Then, an Arseno Silicate Glass (referred to as ASG, hereinafter) film 12 is formed to be uniform in thickness on a surface of the silicon substrate 11, which includes inner surface parts of the slots DT, by using, e.g., chemical vapor deposition (CVD). In addition, a resist film 13, which is an organic film of a predetermined thickness, is formed on the ASG film 12 to completely fill the slots DT.

A part of the resist film 13 is absorbed in the slots DT in the cell array section 1a. Accordingly, on the surface of the silicon substrate 11, the height of the surface of the resist film 13 is lower in the cell array section 1a than that in the field section 1b. Consequently, a step indicated by a solid line is formed on the surface of the resist film 13 with respect to a flat surface indicated by a broken line.

Figure 1B:
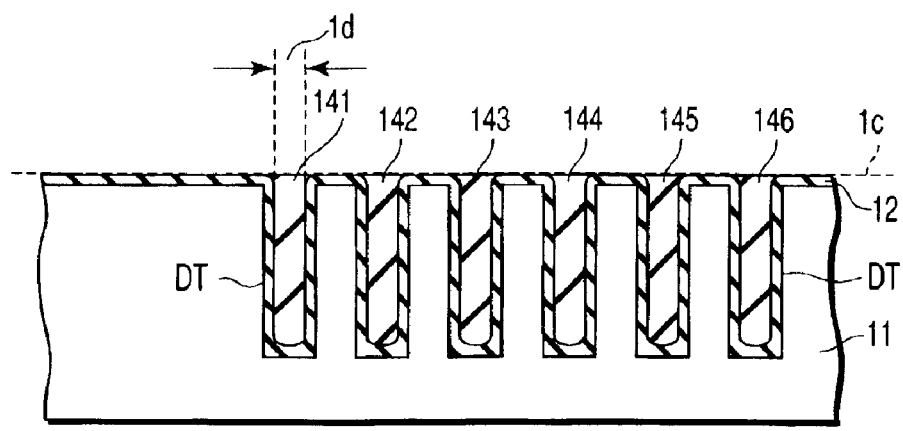

Then, as shown in FIG. 1B, an imaginary line 1c is drawn on a surface of the ASG film 12 formed on the substrate 11 to extend from the cell array section 1a to the field section 1b. The resist film 13 is polished to this line by use of a CMP device and slurry containing resin particles, so that it is flattened. A CMP device is one with a polishing pad fixed to a rotary surface plate, a nozzle for supplying slurry onto the polishing pad, a wafer holding section rotated in a direction opposite that of the rotary surface plate, and a drive unit for operating these components. A wafer or the silicon substrate 11 is fixed by the wafer holding section, the slurry is injected between the wafer and the polishing pad, and the CMP device is driven by the drive unit, whereby a wafer surface is polished.

The resin particles contained in the slurry has a particle size larger than a minimum opening size 1d of a residual opening of the slot DT formed immediately after the forming step of the ASG film 12. Accordingly, in polishing by CMP, the resin particles almost never enter below the imaginary line 1c to drill through the resist in the slots DT. Thus, clogging of the opening with the resin particles almost never occurs.

However, if resin particles are smaller than the above-described particle size, or fragmented, the slots DT may be clogged with the resin particles in the CMP process. On the other hand, the resin particles are unresistant to etching for removing the resist 13. Thus, even if the slots DT are clogged with the resin particles smaller than the predetermined particle size or the fragments of the resin particles in the CMP process, in subsequent etching of resist masks 141 to 146, the resin particles are removed together with the resist masks.

Further, preferably, the resin particles are spherical and are of uniform size. It was found that formation of resin particles by using a polystyrene resin facilitated control of particle size to improve uniformity. Uniformly-sized particles can also improve dispersion of the resin particles in the slurry. Because of the uniform particle size, a wafer surface and a polishing pad surface can be maintained parallel, while they are rotated relatively to each other, whereby the surface of the wafer is uniformly polished.

The ASG film 12 is harder than the resin particles contained in the slurry, and the resin particles are harder than the resist film 13. Accordingly, since the ASG film 12 operates as a stopper film for CMP, only the resist film 13 softer than the resin particles contained in the slurry is polished. Thus, scratches or erosions of the resist film 13 can be surely prevented.

Furthermore, when the slurry was formed, an additive containing, as a component, an organic nitrogen compound having an amine group or the like was added, whereby an etching rate was improved, and the uniformity of the slurry in the polished surface was also improved. In addition, because of small volatility of the additive, good liquid stability of the slurry was verified.

The ASG film 12 is not polished by the slurry containing the resin particles. Accordingly, the patterns for the capacity formed on the surface of the silicon substrate 11 are protected by the ASG film 12.

Therefore, as shown in FIG. 1B, by the CMP method in which the slurry containing the resin particles is used, the resist film 13 is regulated by the surface of the ASG film 12 to be polished, and flattened well in a position of the imaginary line 1c. Thus, the surfaces of the resist masks 141 to 146 in the slots DT are flattened, whereby the resist masks 141 to 146 are formed to be uniform in height in the slots DT.

Figure 1C:
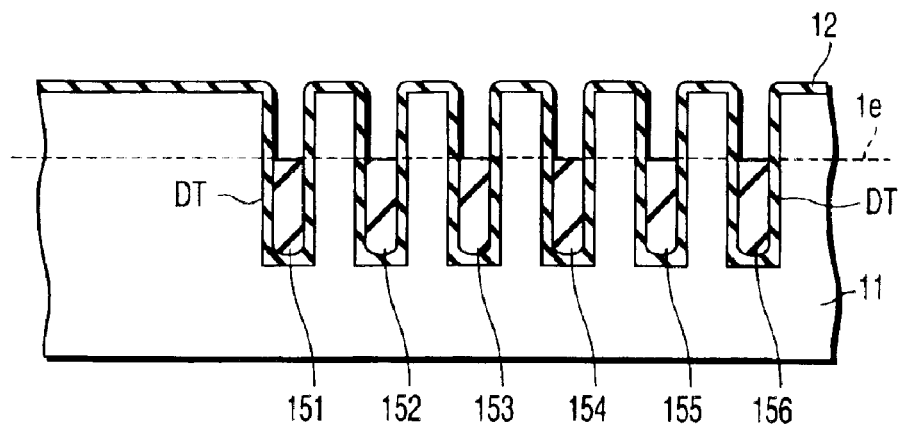

Then, as shown in FIG. 1C, in order to leave a resist mask of a predetermined height from bottoms in the slots DT, each of the resist masks 141 to 146 are etched back by using the imaginary line 1c as a reference. Accordingly, as shown in the sectional view of FIG. 1C, resist masks 151 to 156 are formed, which have equal heights from the bottoms of the slots DT to an imaginary line 1e which is parallel with the imaginary line 1c.

Though not shown, even if resin particles smaller than the predetermined particle size, or fragments of the resin particles are clogged in the slots DT during the CMP process of FIG. 1B, the resin particles or the fragments clogged in the slots DT are removed together with the resist masks 141 to 146 in the current etching step. Thus, in subsequent steps, the resin particles causing clogging have no adverse effects.

Figure 2A:
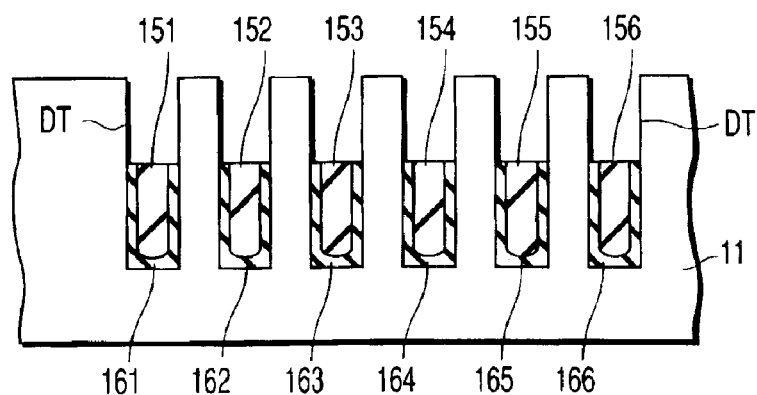
FIGS. 2A to 2D are sectional views showing a sequel to the capacitor forming process of FIGS. 1A to 1C according to the first embodiment of the invention.

Here, FIG. 2A shows a sequel to the capacitor forming process shown in FIG. 1C. As shown in FIG. 2A, the resist masks 151 to 156 are used as etching masks, and a part of the exposed ASG film 12 is removed by wet etching, which uses a hydrofluoric-based etching liquid. Accordingly, ASG films 161 to 166 are remained in the slots DT to be uniform in height.

Figure 2B:
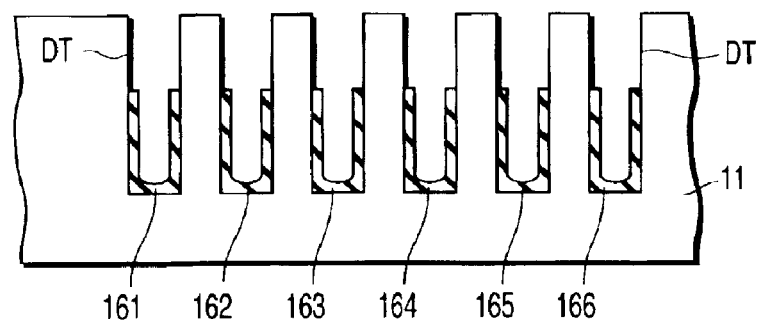

Then, the resist masks 151 to 156 are etched to leave ASG films 161 to 166 having uniform heights from the bottoms in the slots DT, as shown in FIG. 2B.

Figure 2C:
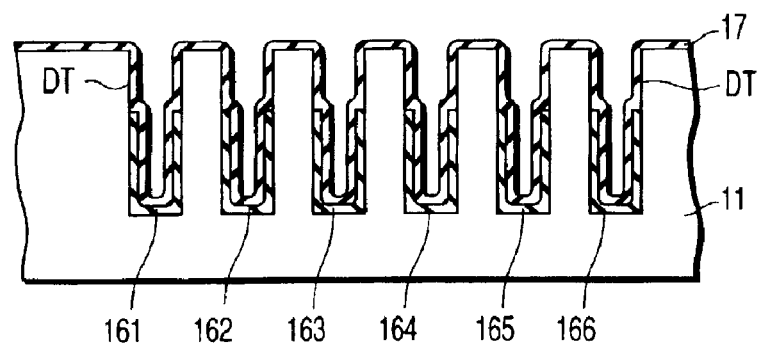

Then, as shown in FIG. 2C, tetraethoxy silane (TEOS) gas is used to form a thin TEOS film 17 uniform in thickness on the surface of the silicon substrate 11, the exposed inner surfaces of the slots DT and the ASG films 161 to 166 by using plasma CVD. Subsequently, the TEOS film 17 is used as a heat-treating film of the silicon substrate 11 to perform a heat treatment, whereby impurities As contained in the ASG films 161 to 166 are diffused in the silicon substrate 11.

Figure 2D:
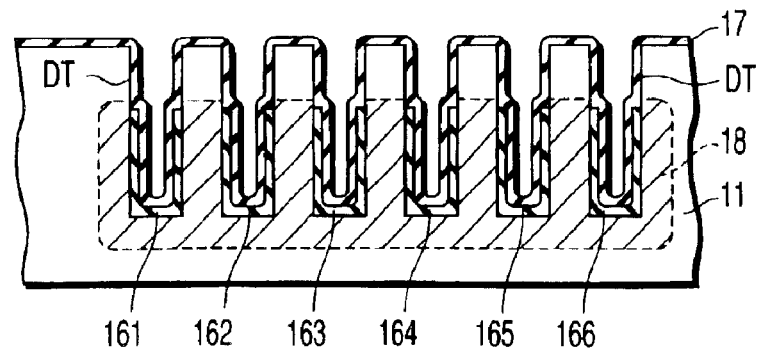

Therefore, as shown in FIG. 2D, an As diffused region 18 having a contact area equal to that of each slot DT is formed as a common electrode for the capacitors in the silicon substrate 11. In this case, diffusion time is set at least to join diffused regions extended from the inner wall surfaces of the slots DT adjacent to each other in the silicon substrate 11 as shown in FIG. 2D.

Figure 3A:
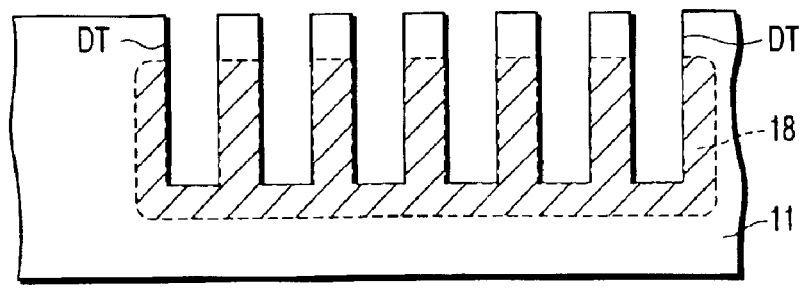
FIGS. 3A to 3D are sectional views showing a sequel to the capacitor forming process of FIGS. 2A to 2D according to the first embodiment of the invention.

FIG. 3A shows a sequel to the capacitor forming process of FIG. 2D, where the TEOS film 17 and the heat-treated ASG films 161 to 166 are etched to be removed.

Figure 3B:
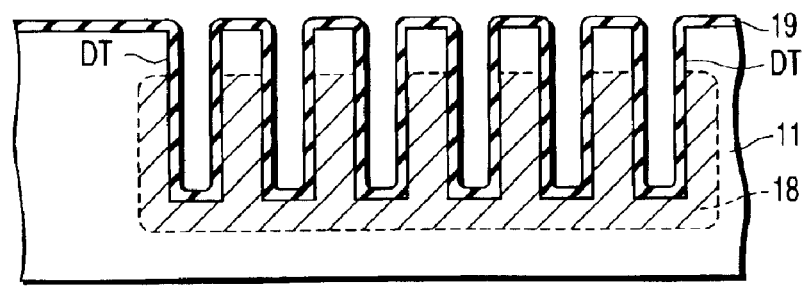

Then, as shown in FIG. 3B, for example, CVD is used to form a nitric oxide (NO) film 19 to a uniform thickness as a capacitor insulating film on a surface of the silicon substrate 11, which includes inner surface parts of the exposed slots DT.

Figure 3C:
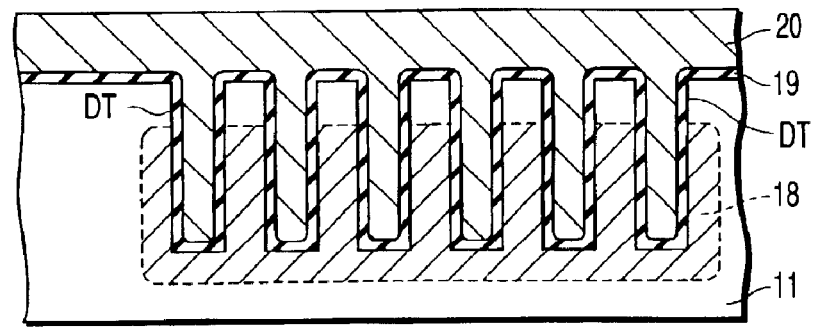

Further, as shown in FIG. 3C, on the NO film 19, a polysilicon film 20 is formed to fill the slots DT.

Figure 3D:
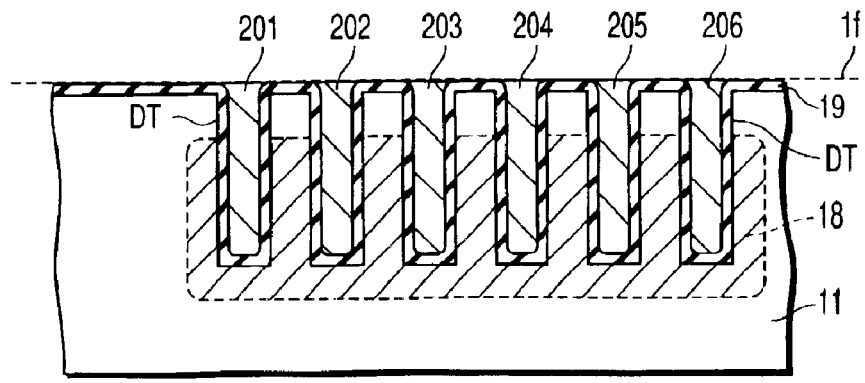

Then, as shown in FIG. 3D, the polysilicon film 20 is etched to an imaginary line 1f on an upper surface of the NO film 19 set in parallel with the imaginary line 1e. Accordingly, in the slots DT, other electrodes 201 to 206 for the capacitors are formed to be insulated from one another by the NO film 19.

As described above, according to the embodiment, the diffused regions uniform in height can be formed along the inner wall surfaces of the slots DT in the silicon substrate 11. Thus, a plurality of diffusion areas having uniform areas for the respective electrodes of the capacitors are formed around the slots DT in the silicon substrate 11, whereby capacities are also set to be uniform among the capacitors.

Therefore, the foregoing conventional problem causing the formation of nonuniform capacitors is solved, thereby reducing the load on the process.

Furthermore, even if resin particles smaller than the predetermined particle size, or fragments of resin particles are clogged in the slots DT during the CMP process, the resin particles may be removed together with the resist remained in the slots DT, since the resin particles are unresistant to etching of the resist film.

The particle size of the resin particles is easily controlled. Thus, the particle size is adjusted to be larger than the opening size id of the slots DT, in which the ASG film 12 shown in FIG. 1D is formed, whereby clogging can be prevented.

Furthermore, in the capacitor formed according to the embodiment, as shown in FIG. 3A, the diffused region 18 formed in the silicon substrate 11 is used as a common electrode of the capacitors. In addition, as described above, since the portions of the diffused region 18 have uniform areas around the respective slots DT, it can be expected that capacitance of each capacitors are also uniform. Thus, for example, when the common electrode formed of the diffused region 18 is grounded, and when the other polysilicon electrodes 201 to 206 are connected to cell transistors of the DRAM memory device, the capacitors of the present embodiment may be used to form memory cells having good characteristics.

Figure 4A:
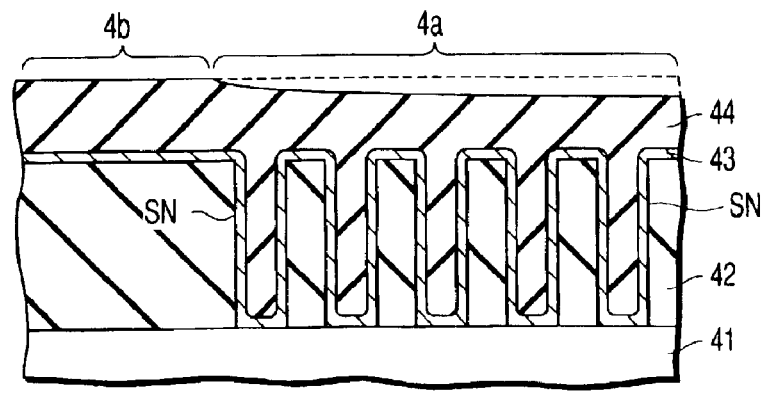
FIGS. 4A to 4D are sectional views showing a capacitor forming process according to a second embodiment of the present invention.

FIGS. 4A to 5C are sectional views showing a capacitor (stack structure) forming process according to a second embodiment of the present invention. As shown in FIG. 4A, an insulating film 42 is formed to a predetermined thickness on a substrate 41. Predetermined patterns for capacitor formation are formed on a surface of the insulating film 42 to form, e.g., a memory cell of a DRAM. A plurality of deep and narrow slots SN are formed to be uniform in size in predetermined parts of the insulating film 42 by using, e.g., a reactive ion etching (RIE) technique. In this case, a region, in which the slots SN are formed, is set as a cell array section 4a, and a region, in which no slots SN are formed, is set as a field section 4b.

Then, a polysilicon film 43 is formed to be uniform in thickness on a surface of the insulating film 42, which includes inner surface parts of the slots SN, by using, e.g., chemical vapor deposition (CVD). In addition, a resist film 44, which is an organic film of a predetermined thickness, is formed on the polysilicon film 43 to completely fill the slots SN. As in the case of FIG. 1A, since the deposited resist is absorbed in the slots SN, a surface of the cell array section 4a of the resist film 44 is lower than that of the field section 4b to form a slope.

Figure 4B:
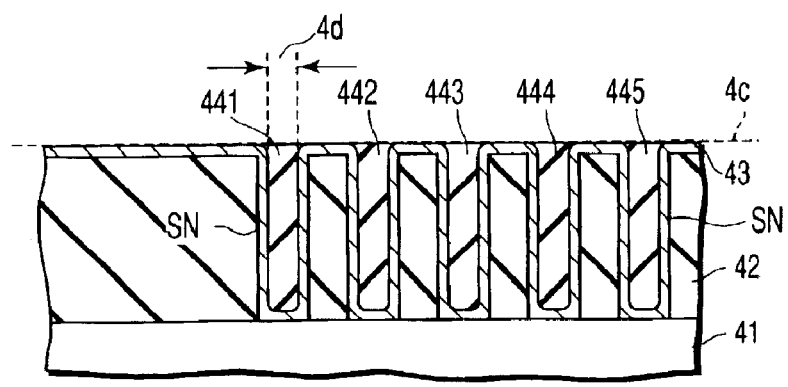

Then, as shown in FIG. 4B, an imaginary line 4c is made on a surface of the polysilicon film 43 formed on the insulating film 42 to extend from the cell array section 4a to the field section 4b. The resist film 44 is polished to this imaginary line 4c to be flattened by a CMP device using slurry containing resin particles, whereby resist masks 441 to 445 are formed in the slots SN.

Each of the resin particles contained in the slurry has a particle size larger than at least a minimum opening size 4d of openings of the slots SN formed immediately after the forming step of the polysilicon film 43. Accordingly, in polishing by CMP, the resin particles almost never enter below the imaginary line 4c to drill through the resin masks 441 to 445 in the slots SN. Thus, the clogging of the openings of the slots SN with the resin particles almost never occurs.

However, if resin particles are smaller than the above-described predetermined particle size, or fragmented, the slots SN may be clogged with the resin particles in the CMP process. On the other hand, the resin particles are unresistant to etching for removing the resist masks 441 to 445. Thus, even if the slots SN are clogged with the resin particles smaller than the predetermined particle size or the fragments of the resin particles in the CMP process, in subsequent etching of the resist masks 441 to 445, the resin particles are removed together with the resistmasks 441 to 445.

Further, preferably, the resin particles are spherical and have an uniform size. Therefore, in the embodiment of FIGS. 4A to 4D, the surfaces of the substrate 41 or the surface of the insulating film 42 and unillustrated polishing pad are maintained parallel while being rotated relatively to each other, whereby a surface of a wafer is uniformly polished.

The polysilicon film 43 is harder than the resin particles contained in slurry, and the resin particles are harder than the resist 44. Accordingly, since the polysilicon film 43 operates as a stopper film for CMP in polishing of the resist 44, only the resist 44 softer than the resin particles contained in the slurry is polished. Thus, scratches or erosions can be surely prevented.

Furthermore, the polysilicon film 43 is not polished or removed by the slurry containing the resin particles. Accordingly, the patterns of the insulating film 42 are protected by the polysilicon film 43.

Therefore, as shown in FIG. 4B, by the CMP method using the slurry containing the resin particles, the resist 44 is horizontally polished to expose the surface of the polysilicon film 43, and flattened on the imaginary line 4c. Thus, the surfaces of the resist masks 441 to 445 in the slots SN are flattened, whereby the resist masks 441 to 445 are formed to be uniform in height in the slots SN.

Figure 4C:
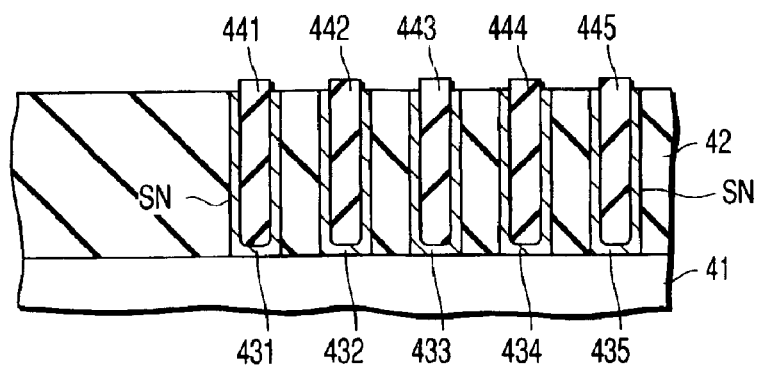

Then, as shown in FIG. 4C, the resist masks 441 to 445 are used as etching masks to etch the exposed portions of the polysilicon film 43. Accordingly, polysilicon films 431 to 435 uniform in size are formed in the slots SN. In this case, the resist masks 441 to 445 have resistance to etching for removing the exposed portions of the polysilicon film 43. Thus, the resist film 44 on the polysilicon film 43 is completely polished by the CMP method, whereby the polysilicon exposed parts can be selectively etched well.

Figure 4D:
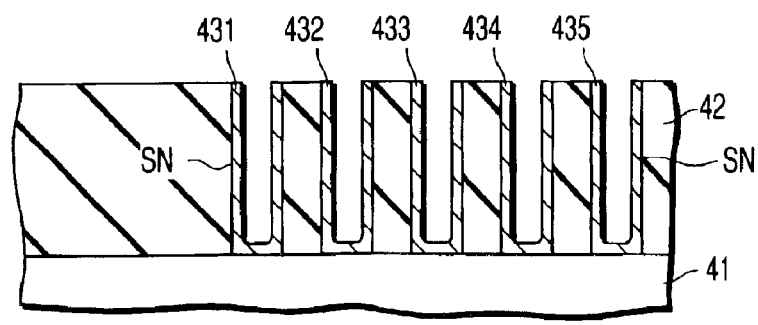

Then, as shown in FIG. 4D, the resist masks 441 to 445 in the slots SN are removed by etching. Further, the insulating film 42 is removed by etching.

Figure 5A:
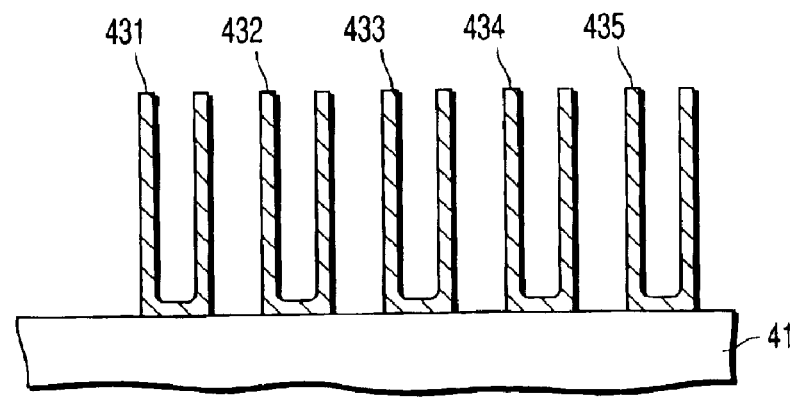
FIGS. 5A to 5C are sectional views showing a sequel to the capacitor forming process of FIGS. 4A to 4D according to the second embodiment of the invention.

Here, FIG. 5A shows a sequel to the capacitor forming process shown in FIG. 4D. As shown in FIG. 5A, polysilicon films 431 to 435 U-shaped in section are formed as first electrodes 431 to 435 of the capacitors on the substrate 41.

Figure 5B:
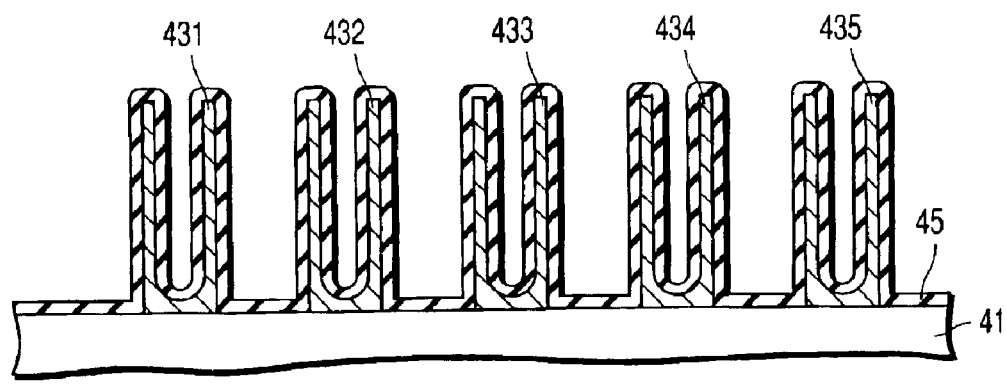

A nitric oxide (NO) film 45 is formed on the surfaces of the first electrodes 431 to 435, and the substrate 41. Thus, as shown in FIG. 5B, a capacitor insulating film is formed on the substrate 41 and the first electrodes 431 to 435.

Figure 5C:
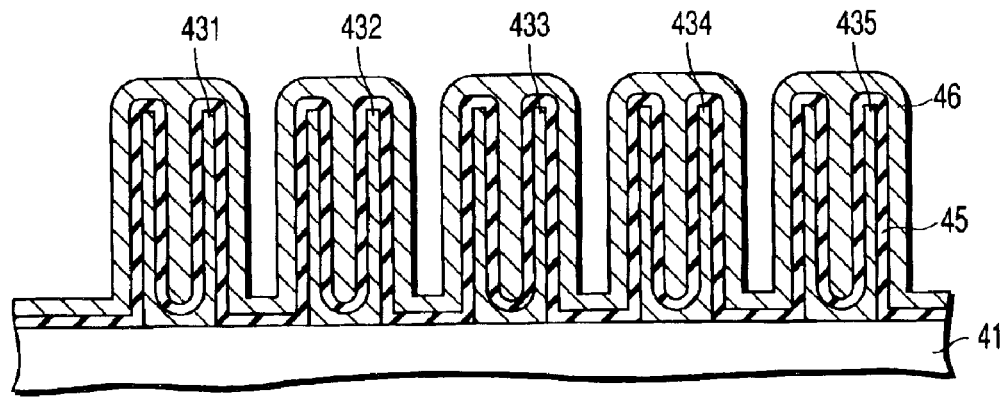
Figure 6A:
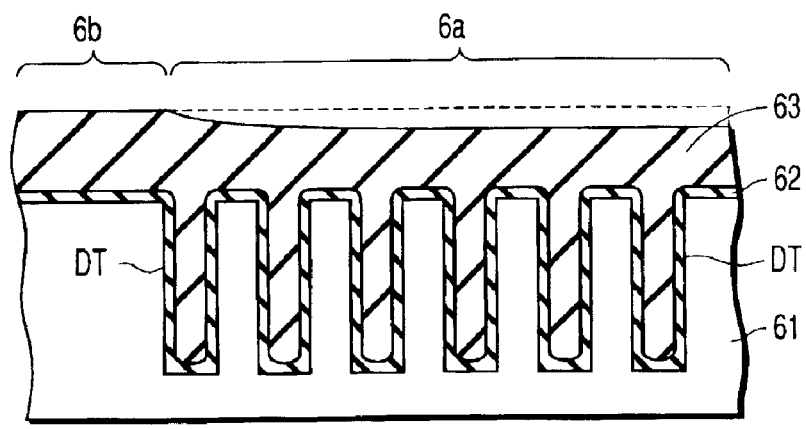
FIGS. 6A to 6C are sectional views showing a capacitor forming process according to a first conventional example.
Figure 6B:
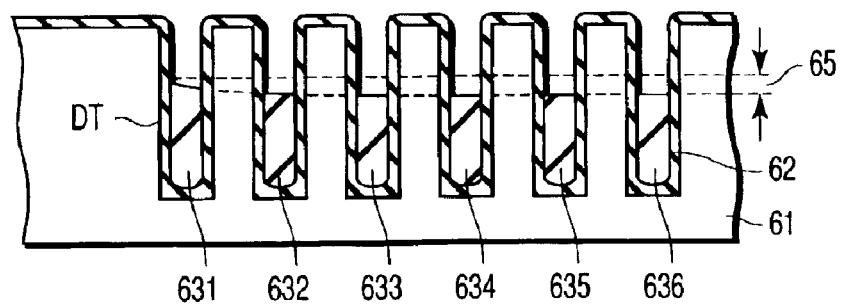
Figure 6C:
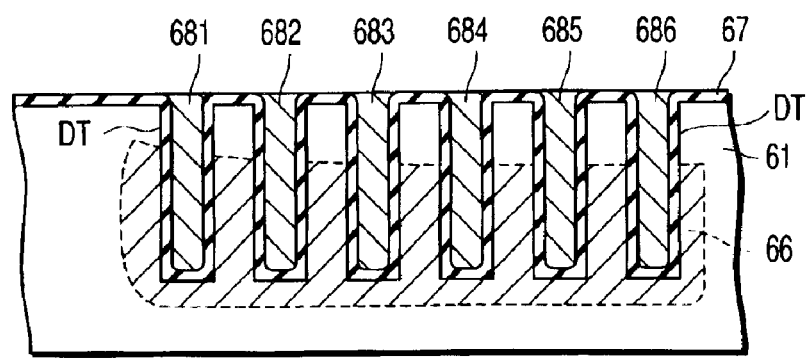
Figure 7A:
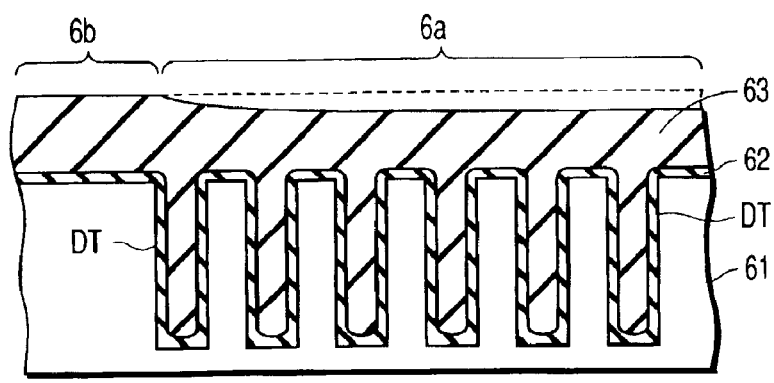
FIGS. 7A to 7D are sectional views showing a capacitor forming process according to a second conventional example.
Figure 7B:
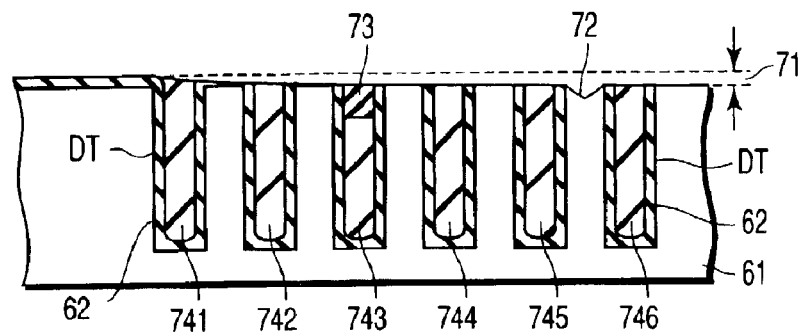
Figure 7C:
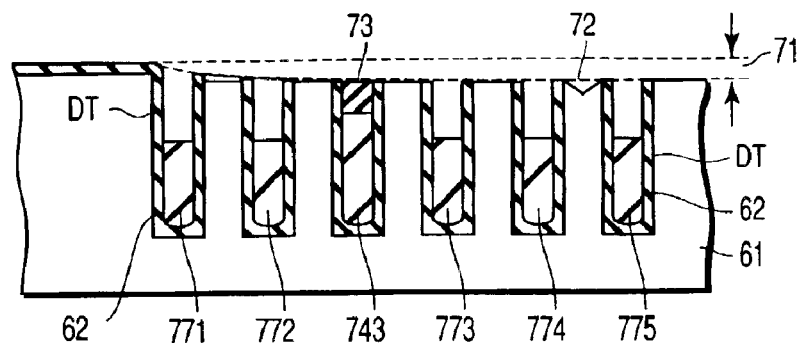
Figure 7D:
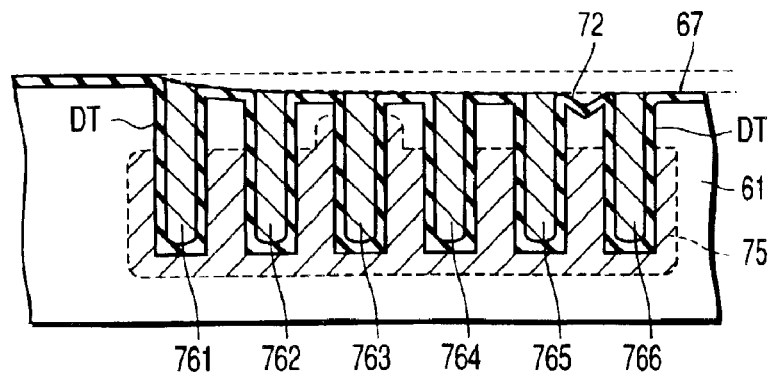
Figure 8A:
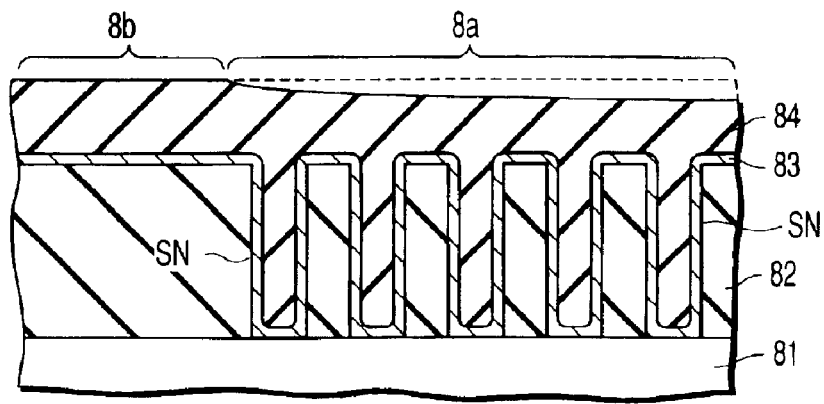
FIGS. 8A to 8C are sectional views showing a capacitor forming process according to a third conventional example.
Figure 8B:
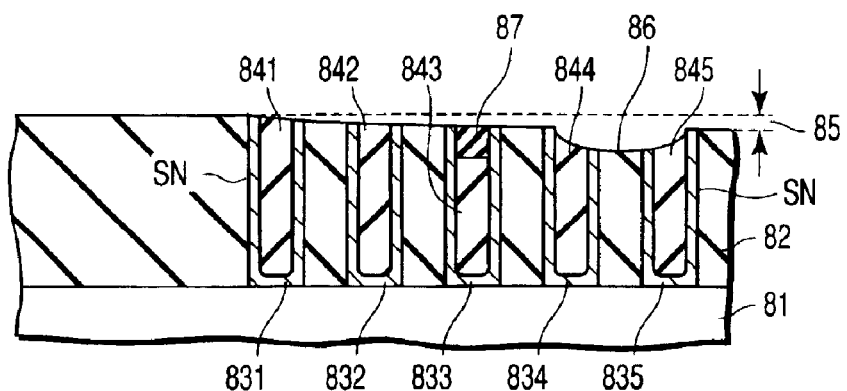
Figure 8C:
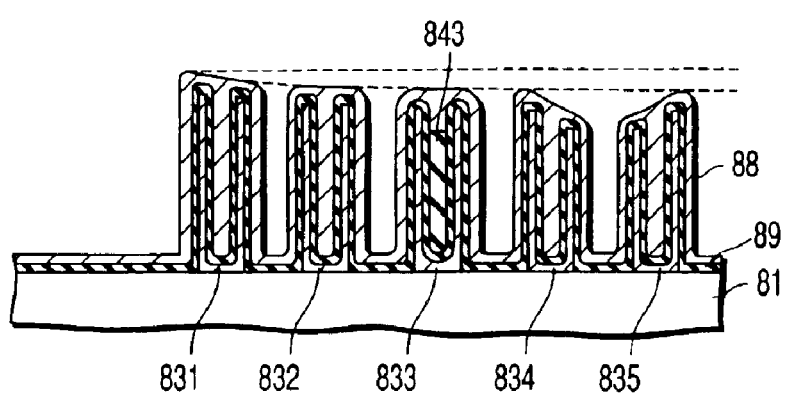

Then, a polysilicon film 46 is formed on the capacitor insulating film 45 to fill the slot of the capacitor insulating film 45 formed in each of the first electrodes 431 to 435. Accordingly, as shown in FIG. 5C, the polysilicon film 46 is formed as a second or a common electrode on the capacitor insulating film 45, thereby forming capacitors having first electrodes 431 to 435 and second common electrode 46.

As described above, according to the second embodiment, heights of the resist masks 441 to 445 in the slots SN are made uniform by the CMP using the resin particles to form the first electrodes 431 to 435 of the capacitors having uniform surface areas. Thus, the NO film 45 and the polysilicon film 46 formed on the upper surfaces thereof are also formed to be uniform corresponding to the first electrodes 431 to 435. Therefore, capacitors having uniform capacities are formed on the substrate 41, and capacities are also set to be uniform among the capacitors.

Therefore, the foregoing conventional problem caused the formation of nonuniform capacitors is solved to reduce the load on the process.

Furthermore, even if resin particles smaller than the predetermined particle size, or fragments of resin particles, with which the slots SN have been clogged, are present in the CMP process, the resin particles are unresistant to etching of the resist film, and consequently removed together with the resist film. Therefore, even if the slots SN are clogged with the resin particles smaller than the predetermined particle size or fragments of the resin particles during the CMP, no resist film will be left in the slots SN until the capacitors are completed. As a result, it is possible to prevent formation of capacitors that will malfunction.

In addition, the particle size of the resin particles is easily controlled. Thus, the particle size is adjusted to be larger than the opening size 4d of the slots SN, in which the polysilicon film 43 shown in FIG. 4D is formed, whereby clogging can be prevented.

Furthermore, in the capacitor formed according to the embodiment, as shown in FIG. 5C, the polysilicon film 46 formed on the uppermost surface is integrated as the second electrodes of the capacitors, and capacities of capacitors corresponding to the second electrodes 431 to 435 are uniform. Thus, for example, the second electrode 46 is grounded, and the first electrodes 431 to 435 are connected to cell transistors of a DRAM memory device, whereby memory cells having good characteristics can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method for polishing an organic film, comprising polishing a semiconductor substrate having an exposed organic film by use of slurry containing resin particles, wherein the organic film is formed on an uneven substrate including inner parts of a plurality of slots, and a particle size of the resin particles is larger than an opening size of the slots.

2. The polishing method according to claim 1, further comprising chemically and mechanically polishing the organic film by use of the slurry containing the resin particles.

3. The polishing method according to claim 2, wherein the slurry containing the resin particles is a suspension prepared by dispersing the resin particles in a liquid to be used for a chemical polishing of the organic film.

4. The polishing method according to claim 3, wherein the resin particles are spherical particles comprising a polystyrene resin.

5. The polishing method according to claim 4, wherein the resin particles have a substantially uniform particle size.

6. The polishing method according to claim 3, wherein the slurry containing the resin particles contains an organic nitrogen compound as an additive.

7. The polishing method according to claim 1, wherein the resin particles are unresistant to etching for removing the organic film left in the inner parts of the plurality of slots after the organic film formed on the substrate has been polished to remove partially by use of the slurry.

8. The polishing method according to claim 1, wherein at least a surface of the substrate on which the organic film is formed is harder than the resin particles.

9. A method for polishing, comprising polishing a semiconductor substrate having an exposed organic film by use of slurry containing resin particles, wherein the organic film is a resist film which is formed on an uneven substrate including inner parts of a plurality of slots, and a particle size of the resin particles is larger than an opening size of the slots.

10. The polishing method according to claim 9, further comprising chemically and mechanically polishing the organic film by use of the slurry containing the resin particles.

11. The polishing method according to claim 10, wherein the slurry containing the resin particles is a suspension prepared by dispersing the resin particles in a liquid to be used for a chemical polishing of the organic film.

12. The polishing method according to claim 11, wherein the resin particles are spherical particles comprising a polystyrene resin.

13. The polishing method according to claim 9, wherein the resin particles are unresistant to etching for removing the organic film left in the inner parts of the plurality of slots after the organic film formed on the substrate has been polished to remove partially by use of the slurry.

14. The polishing method according to claim 11, wherein the slurry containing the resin particles contains an organic nitrogen compound as an additive.

* * * * *